(12) United States Patent
Sturges et al.

(10) Patent No.: US 7,412,342 B2
(45) Date of Patent: Aug. 12, 2008

(54) LOW COST TEST FOR IC'S OR ELECTRICAL MODULES USING STANDARD RECONFIGURABLE LOGIC DEVICES

(75) Inventors: Stephen S. Sturges, Portland, OR (US); Brad Inman, Hillsboro, OR (US); Robert C. Hash, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/975,855

(22) Filed: Oct. 28, 2004

(65) Prior Publication Data

US 2006/0100812 A1    May 11, 2006

(51) Int. Cl.
*G01R 31/00*    (2006.01)
*G01R 31/14*    (2006.01)

(52) U.S. Cl. .................................................... 702/117
(58) Field of Classification Search ......... 702/117–121, 702/123; 324/537, 763
See application file for complete search history.

(56) References Cited

U.S. PATENT DOCUMENTS

| | | | |
|---|---|---|---|
| 5,633,813 A | 5/1997 | Srinivasan | |
| 6,484,280 B1 | 11/2002 | Moberly | |
| 6,937,006 B2 * | 8/2005 | West | 324/158.1 |
| 6,940,271 B2 * | 9/2005 | West | 324/158.1 |
| 6,996,757 B2 * | 2/2006 | Evans | 714/724 |
| 2004/0230395 A1 * | 11/2004 | Basto | 702/117 |
| 2004/0250190 A1 * | 12/2004 | Norrgard et al. | 714/742 |
| 2005/0110513 A1 * | 5/2005 | Osada et al. | 324/765 |
| 2005/0138500 A1 * | 6/2005 | Sul et al. | 714/724 |
| 2006/0069967 A1 * | 3/2006 | Almy et al. | 714/724 |

OTHER PUBLICATIONS

Davis J. S. et al., "Multi-purpose Digital Test Core Utilizing Programmable Logic", Proceedings International Test Conference 2002, Baltimore, MD., Oct. 7-10, 2002, International Test Conference, New York, NY: IEEE, US, Oct. 7, 2002, pp. 438-445, XP010609770, ISBN: 0-7803-7542-4. The whole document.

PCT International Search Report, PCT/US2005/039319, filing date Oct. 27, 2005, Applicant, Intel Corporation.

* cited by examiner

*Primary Examiner*—Michael P Nghiem
(74) *Attorney, Agent, or Firm*—Blakely, Sokoloff, Taylor & Zafman LLP

(57) ABSTRACT

Low cost test for Integrated Circuits or electrical modules using a reconfigurable logic device is described. In one embodiment, the invention includes configuring a reconfigurable logic device to comply with input standards of a device under test, applying test signals to the device under test, detecting output results of the device under test, and analyzing the detected output results.

27 Claims, 3 Drawing Sheets

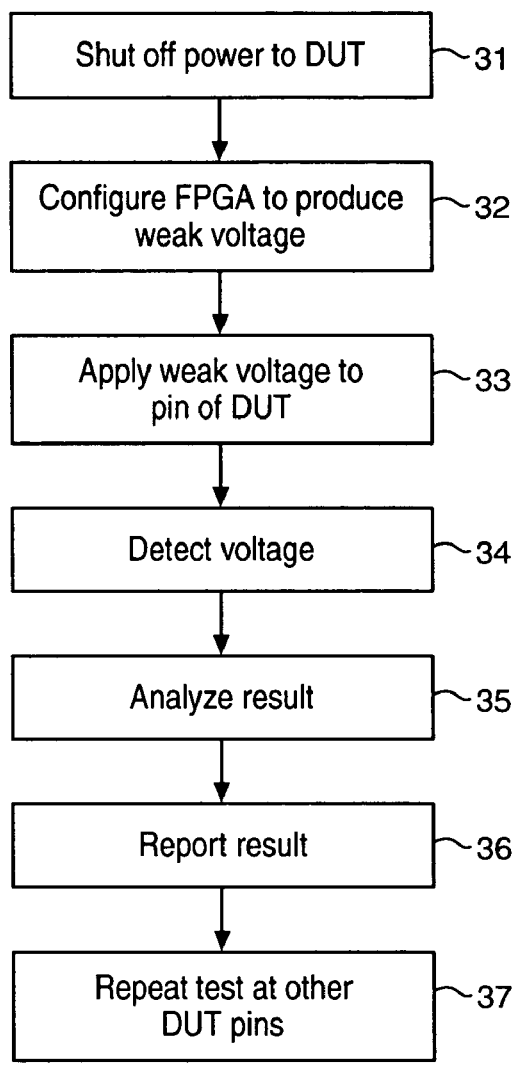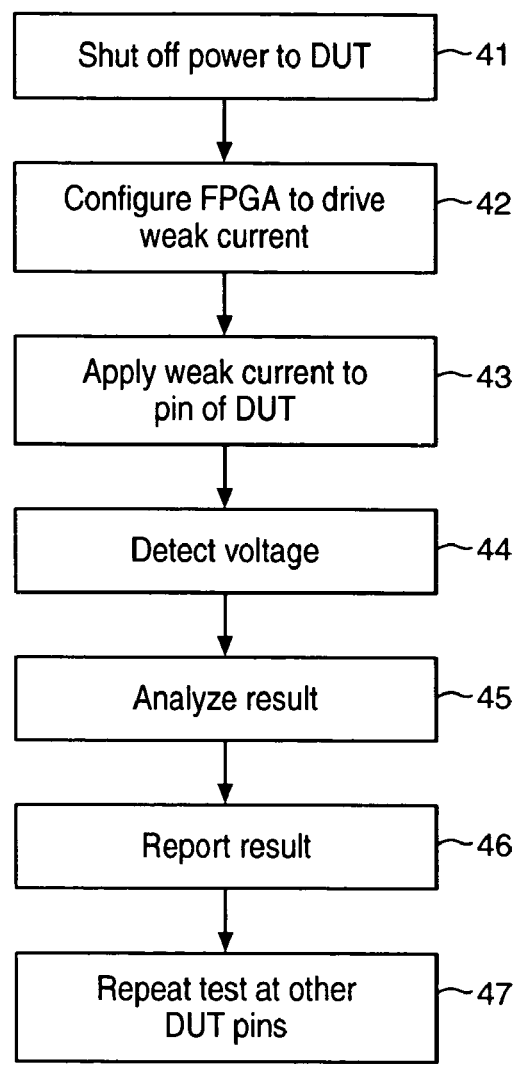

LOW COST TEST FOR IC'S OR ELECTRICAL MODULES USING STANDARD RECONFIGURABLE LOGIC DEVICES

BACKGROUND

1. Field

The present description relates to the field of testing integrated circuits and electrical modules, and in particular to a low cost, test system using standard, high volume, reconfigurable components

2. Background

Integrated circuits (IC's) and electrical modules are typically tested before being released for sale. In normal semiconductor production processes, every single IC is tested for faults. A diagnostic test is often performed as well, so that systematic errors in production may be remedied. The test equipment is large and expensive and must be programmed and electrically configured for each new product. For many products, one piece of test equipment is required to test the IC when it is not powered. Another piece of test equipment is required to test the IC when it is powered but not functioning and a third piece of test equipment is required to test the IC when it is powered and functioning. The considerable expense in acquisition and maintenance for all of the test equipment is a significant factor in the cost of an IC or electrical module.

BRIEF DESCRIPTION OF THE DRAWINGS

Embodiments of the present invention will be understood more fully from the detailed description given below and from the accompanying drawings of various embodiments of the invention. The drawings, however, should not be taken to be limiting, but are for explanation and understanding only.

FIG. 3 is a process flow diagram of performing unpowered tests on an IC according to an embodiment of the invention;

FIG. 4 is a process flow diagram of performing unpowered tests on an IC according to another embodiment of the invention.

DETAILED DESCRIPTION

In one embodiment, an integrated circuit or other electrical module may be tested using a single standard FPGA (Field Programmable Gate Array) and a voltage detector. Such an FPGA can be configured to perform tests above 500 MHz including complete electrical protocols and stimulus-response tests. The FPGA may be reconfigured several times during a test sequence to support different test modes. The tests may include unpowered and powered fully functional states. The reconfiguration may be applied to an I/O (Input/Output) cell or to the entire FPGA. Reconfiguring the I/O cell allows different pin configurations on the DUT (Device Under Test) to be accommodated without rewiring the test equipment.

A small, inexpensive device, such as an FPGA may be coupled directly to the DUT with very short connecting paths. A typical FPGA has enough I/O ports to analyze outputs on all of the pins of many different possible IC's or electrical modules. A typical FPGA is also capable of operating at high speed but at very low voltages and impedances. This simulates a real operating environment and reduces electrical interference that may be caused by a large, expensive, general test fixture. In addition, an FPGA may be quickly reprogrammed to perform many different, complex, analytical and diagnostic routines.

Figure 1:
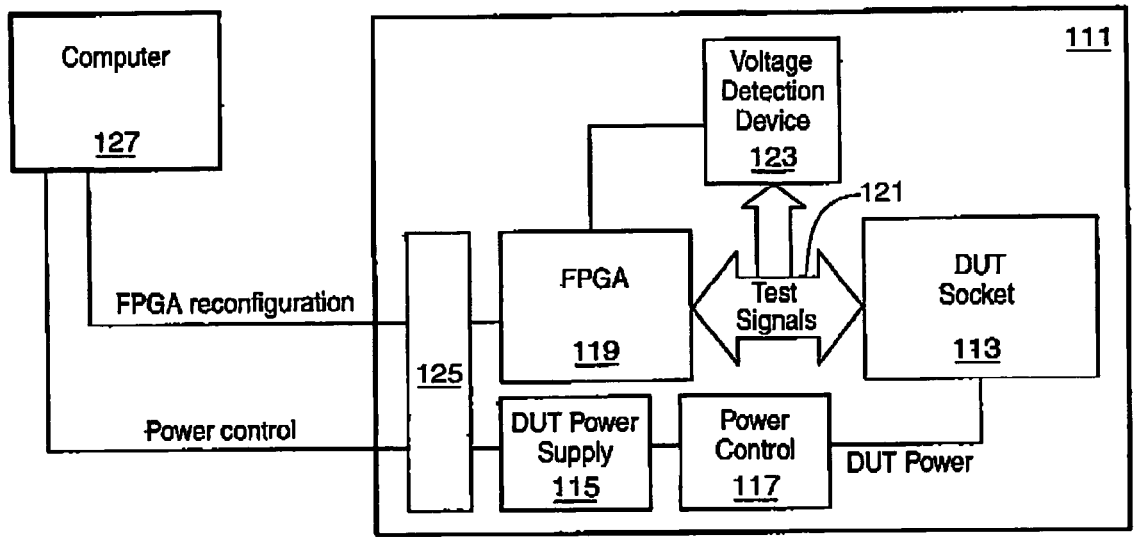
FIG. 1 is a block diagram of a text fixture for socketable integrated circuits according to an embodiment of the invention.

FIG. 1 shows an example of a test system that may be used to drive tests through an IC or electrical module using a dynamically reconfigurable logic device, such as an FPGA. A circuit board, such as a conventional printed wiring board 111 carries a socket or interface connector 113 for the device that is to be tested. The socket is coupled to a power supply 115 through a power controller 117, such as a voltage regulator module. The particular choice of power supply and power controller will depend upon the device to be tested. A socket is shown to provide convenience in replacing DUT's after each test, however, the DUT may be coupled directly to the board or coupled to the board in any other way.

The socket is also connected to an FPGA 119. A typical FPGA offers dynamically reconfigurable I/O cells and connecting logic. Any other small programmable device that offers similar or sufficient capability may be used instead of an FPGA. Such devices may include ASIC's (Application Specific Integrated Circuit), DSPs (Digital Signal Processors), MCH (Memory Controller Hub) chips and other devices. Alternatively, a small group of devices may be used, for example a microprocessor and supporting chipset.

A set of circuit board traces 121 connect the pins of the socket to pins of the FPGA. The traces are tapped by a voltage detection device 123 that is coupled to the other inputs of the FPGA. The voltage detection device may be a simple comparator with a reference voltage input, a DUT voltage input and a single plus or minus output. Alternatively, a more complex voltage comparator or analog to digital converter may be used. The voltage detection device may be coupled to the FPGA only to transmit data or signals to the FPGA. Alternatively, this connection may support two-way communication so that the FPGA may control the operation of the voltage detection device. As a further alternative, an additional controller (not shown) or the station controller 127 may directly control the operation of the voltage detection device. This additional controller may be integrated with or in communication with the external interface 125.

The FPGA and the power supply are both coupled to an external interface 125 of the circuit board. They may be coupled to the same interface or each to a separate interface. The interface may be any of a variety of different types, such as JTAG (Joint Test Action Group), USB (Universal Serial Bus), RS-232 or RS-485 (Revised Standard of the Electrical Industries Association), or any other interface suitable for communication with the FPGA and the power supply with sufficient speed.

A microcomputer 127 is coupled to the external interface to control the operation of the FPGA and the power supply. The microcomputer provides a user interface, such as a display and a keyboard (not shown) and may be programmed to read outputs from the FPGA and to reprogram the FPGA to run different tests. Any conventional microcomputer, such as an Intel® architecture Pentium® personal computer may be used.

The microcomputer may be further coupled to a network (not shown) to report or record test results and the microcomputer may be coupled to several additional test boards similar to the test board 111 of FIG. 1 at the same time to manage multiple test cycles simultaneously. Alternatively, a controller may be provided on the test board to autonomously drive test procedures. This independent controller may be networked to the station controller microcomputer 127 or coupled to other production or control equipment. As an alternative, the station controller may be provided on the test board as a microcontroller with or without supporting I/O chips. The on-board station controller may be coupled directly to the FPGA, power supply, or power controller and the voltage detection device. The on-board station controller may also have or be coupled to an external interface to communicate with external equipment.

Figure 2:
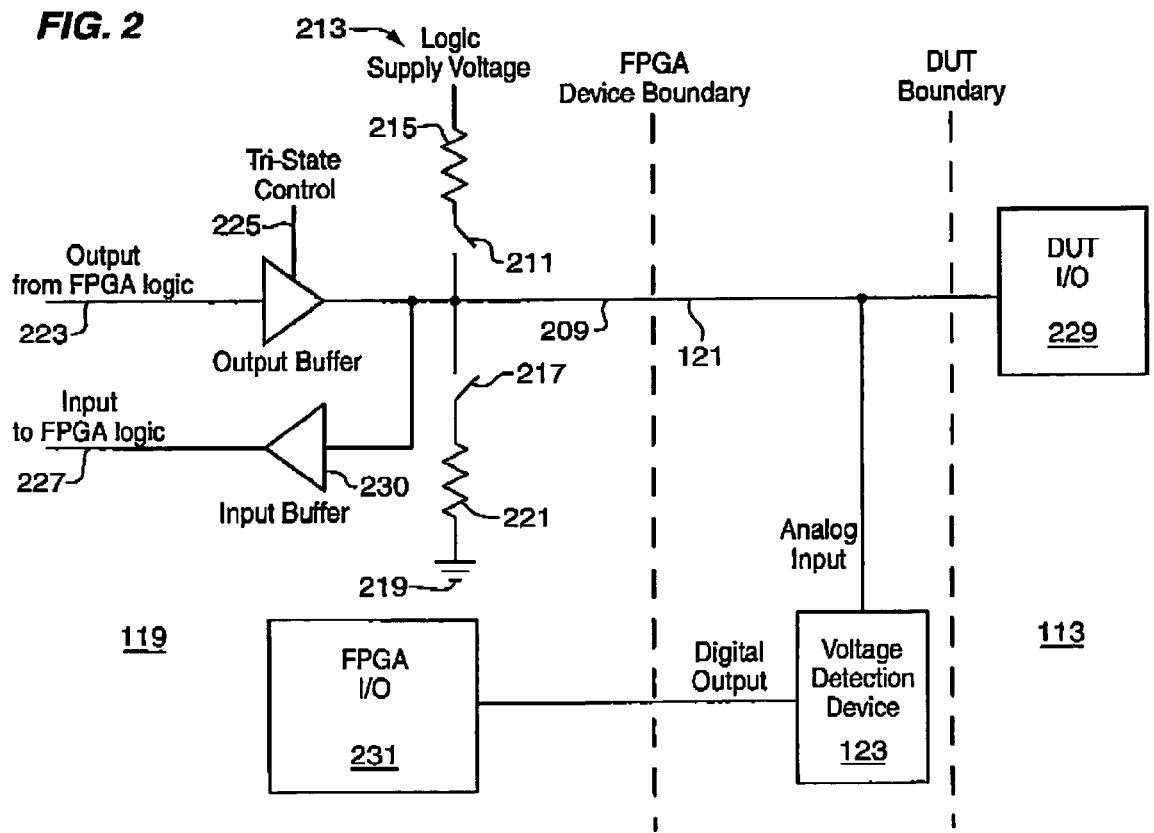
FIG. 2 is a schematic diagram of an interface between an FPGA and a socket in the test fixture of FIG. 1.

FIG. 2 is a diagram representing examples of connections between a single pin connector of the socket for the DUT and a single pin of the dynamically reconfigurable logic device of FIG. 1. While connections for a single pin are shown, Each pin of a DUT may be coupled to a different pin of the FPGA through a line trace. The voltage detection device may be independently coupled to each line trace to provide measurements of all of the connections. For particularly large pin counts more than one FPGA and more than one voltage detection device may be used. The actions of the devices may all be coordinated through the station controller 127 or through on-board logic.

The socket 113 for the DUT is shown on the right side of FIG. 2 coupled through a circuit board trace 121 to the FPGA 119 on the left side of the Figure. The circuit board trace is tapped by the voltage detection device 123 that senses the analog voltage level on the trace. The voltage detection device converts this detected signal to a digital signal that may be supplied to a pin of the FPGA. The FPGA may apply various types of detection algorithms to the voltage, depending on the test. These detection algorithms may sense frequency, rise time, protocol responses, timing and voltage level, among others.

A reconfigurable logic device such as an FPGA may have a configurable I/O cell on each of its pins. The I/O cell allows the user to select different uses for the pin. These may include use as in input, an output, a tri-state controlled output, a pull-up resistance to the logic supply voltage level, a pull-down to ground, and a programmable drive current. These choices allow a great variety of different tests to be performed on a connected device. Such tests may include opens and shorts testing and high speed functional testing.

Inside the FPGA 119, as shown in FIG. 2, a configurable I/O pin 209 that is coupled to the illustrated circuit board trace 121 has several different configurable options. These include a switch 211 coupled to a logic supply voltage 213 through a pull-up resistor 215. Another switch 217 couples the pin to ground 219 through a pull-down resistor 221. The pin may also be configured to be coupled to a logic output 223, through a tri-state control amplifier 225. The pin may also be coupled to a logic input 227 through an input buffer 230.

FIG. 2 shows examples of some of the configuration options that may be available on some FPGA devices. More or fewer configuration options may be provided depending upon the particular device. Some or all of these configuration options may be used in any one test. The configurable I/O pin is shown as connected to a single pin 229 of the DUT.

As further shown in FIG. 2, the configurable logic device 119 has an input 231 that is coupled to the voltage detection device. This input may detect only a value as above or below a threshold. It may also detect a time of arrival from the voltage detection device, rise time, and frequencies of changes. If the voltage detection device is more complex, it may generate a multi-bit digital representation of a voltage value and frequent updates about any voltage changes. The logic device input 231 may also be used as a controller for the voltage detection device. As such, it may output commands or voltage levels to the voltage detection device, to change thresholds, bandwidths, passbands etc.

The hardware configuration of FIGS. 1 and 2 may be used to perform a variety of different tests simply by reprogramming the FPGA. One such test, shown in FIG. 3, is a detection of open signal nets within the device. This test may be performed when the device is not powered, block 31. Power to the DUT may be controlled by the control station 127 through the DUT power supply 115 and power control 117. In one example, one of the FPGA I/O pins 209 is configured, at block 32, with a pull-up resistor 215 of from 10-60 Kohms. This pin of the FPGA is applied to weakly pull up a pin 229 of the unpowered DUT at block 33. The specific voltage will depend upon the nature of the DUT, its connection to the configurable logic device and the capabilities of the I/O pin.

The voltage level through the net coupled to the connected pin may be detected at block 34 by the voltage detection device 123 which is coupled to the same pin. The resulting measurement is analyzed by the FPGA at block 35. If the net within the unpowered DUT is defective because it is open, then the voltage on the pin will be pulled up by the voltage applied to the DUT pin. When the voltage is measured on the net it will be pulled up to the logic supply voltage value provided by the FPGA pull-up resistor. If the net is good, then the voltage may be close to 0 because the loaded unpowered circuit looks like a short compared to the 20-60 KOhms pull-up resistor internal to the FPGA.

Because the applied current is weak, the DUT is not damaged by any of the effects of any shorts through the unpowered signal nets of the DUT. The measured results from the voltage detection device may be analyzed within the FPGA 231 at block 35, or simply reported to the control station 127 at block 36 or both. This testing may be repeated at block 37 for each electrical net on the DUT by connecting it to a corresponding pin on the FPGA device.

Another test that may be performed by the FPGA and test circuit board device is a detection of opens or shorts. The FPGA may be configured to drive a weak current, for example 2 mA on the net without any pull-up or pull-down resistors configured in the FPGA I/O cell. To do this, first the power to the DUT is shut off at block 41, as shown in FIG. 4. The FPGA may be configured at block 42 by setting a high logic output 223 through the controlled amplifier 225. The weak current is applied to a pin of the DUT at block 43 to force the current through the DUT while it is unpowered. The current level is selected to be so low that it will not damage the DUT or the FPGA but high enough that any shorts or opens can be detected.

The voltage detection device 123 at block 44 will detect a voltage on this net within the DUT due to the current flowing from the FPGA and into the DUT. In normal operation, the voltage is much lower than the logic supply voltage. If the detected voltage is close to or equal to the logic supply voltage, then the net is probably an open circuit and the DUT is defective. If the detected voltage is zero or close to zero, then the DUT may be shorted on this net and is defective. The detected voltage is analyzed at block 45 and then reported to the station controller at block 46.

This testing for opens and shorts may be repeated at block 47 for each electrical net on the DUT by connecting it to a corresponding pin of the FPGA. In addition, while each pin is tested, the voltage on the other pins not being tested may also be measured. A voltage on one of the other pins would suggest a short between that pin and the pin being tested.

Figure 5:
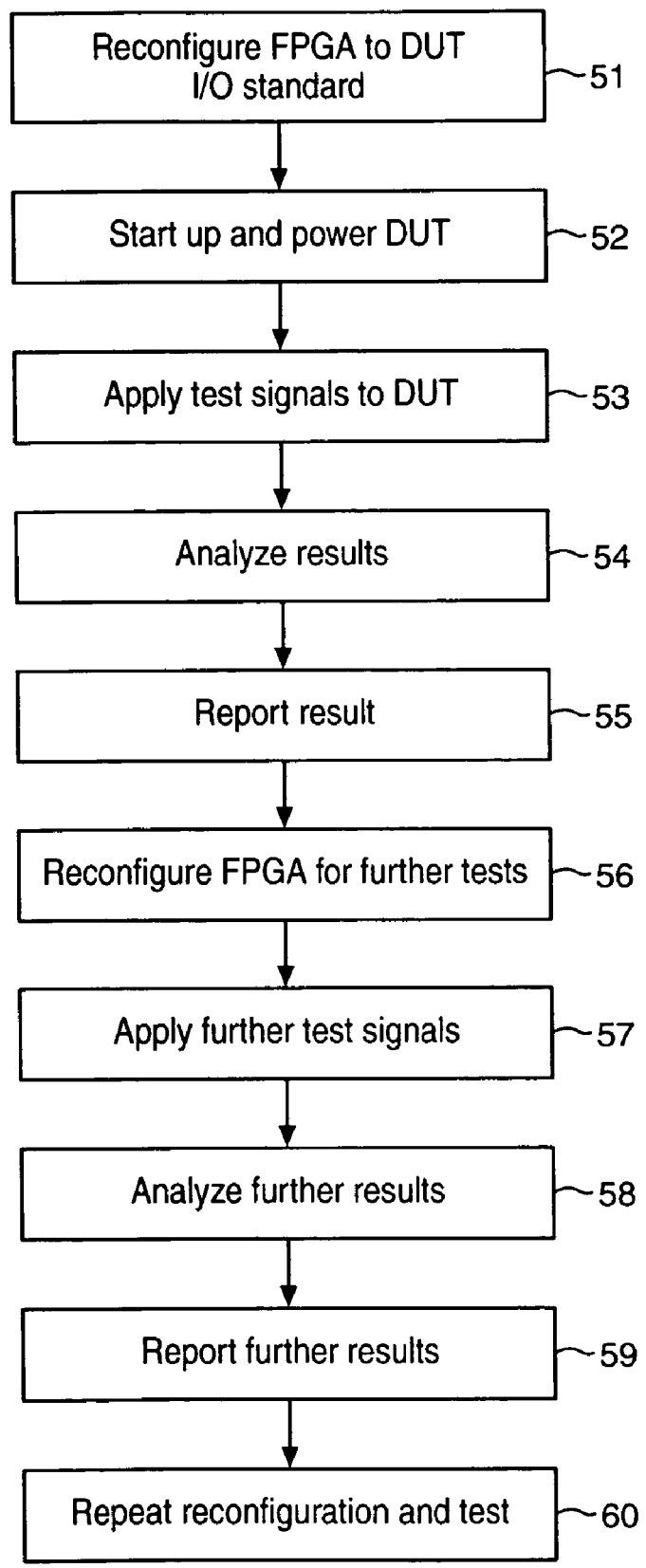
FIG. 5 is a process flow diagram of performing powered tests on an IC according to an embodiment of the invention.

A powered non-functional test may be made, as shown in FIG. 5, by configuring the FPGA to be compatible with the I/O standards for the DUT at block 51, before power is applied to the DUT. This reconfiguration may be driven by the microcomputer station controller 127 through the external interface. The particular configuration will depend upon the particular tests to be run and the design of the FPGA. After reconfiguration, the microcomputer may then command the power supply to power up the DUT at block 52.

Different tests may be conducted while the DUT is in reset or test state. In one example, pairs of differential signals may be applied to pins of the DUT from the FPGA at block 53. The logic of the FPGA may be set to provide particular signals with known timing. The test signals may be configured as single ended signals to perform stand alone tests of particular pins. For single-ended signals, the voltage detection device may be used to detect logic low or high on each trace, as well as timing. The voltage detection device may be used to measure signal inputs as well as outputs. Outputs, such as clocks, that are functional in a reset or test state may be detected and verified by the voltage detection device as well. Using the voltage detection device and the FPGA, the timing, level and frequency of signals on other pins may be measured, block 54.

Upon completion of the powered test or as each test is conducted, the results may be reported to the station controller, block 55. Using the test equipment described herein, the dynamically reconfigurable logic device may be reconfigured again, block 56, to perform further tests. The reconfiguration may be at a logic level or in the physical characteristics of the output pin or both. New test signals may then be applied to the still powered DUT, block 57, and these results analyzed, block 58. These results are also reported, block 59 and the reconfiguration and further testing may be repeated again and again, block 60, until the DUT is sufficiently tested. The flexible nature of the FPGA allows the station controller to drive complex test routines without changing any of the hardware or connections.

Although the description of the various embodiments refers primarily to using an FPGA in conjunction with an integrated circuit socket, the various embodiments may also be used with other types of test controllers, electrical devices and carriers for electrical devices. The various embodiments may also be used to perform different tests than those described.

Embodiment of the present invention may be provided as a computer program product which may include a machine-readable medium having stored thereon instructions which may be used to program a control station, a microcontroller or other electronic device to perform a process. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media or machine-readable medium suitable for storing electronic instructions. Moreover, embodiments of the present invention may also be downloaded as a computer program product, wherein the program may be transferred from a remote computer or controller to a requesting computer or controller by way of data signals embodied in a carrier wave or other propagation medium via a communication link (e.g., a modem or network connection).

It is to be appreciated that a lesser or more complex reconfigurable logic device, voltage detection device, socket, and printed wiring board than the examples described above may be preferred for certain implementations. In addition, lesser or more complex test processes may be preferred for particular implementations. Therefore, the configurations and the processes may vary from implementation to implementation depending upon numerous factors, such as the nature of the DUT, available time for testing, performance requirements, technological improvements, or other circumstances. Embodiments of the invention may also be applied to other types of systems that use different devices than those shown in the Figures.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular reconfiguration and testing techniques disclosed. In other instances, well-known structures and techniques have not been shown in detail to avoid obscuring the understanding of this description.

While the embodiments of the invention have been described in terms of several embodiments, those skilled in the art will recognize that the invention is not limited to the embodiments described, but may be practiced with modification and alteration within the spirit and scope of the appended claims. The description is thus to be regarded as illustrative instead of limiting.

What is claimed is:

1. A method comprising
configuring a reconfigurable logic device to comply with input standards of a device under test;
setting an electrical configuration of an I/O pin of the logic device, the I/O pin being directly coupled to a pin of the device under test;
applying test signals to the device under test through the I/O pin;
detecting output results of the device under test at a signal detector, the signal detector being coupled to the reconfigurable logic device for two-way communication to receive control signals from the logic device; and
analyzing the detected output results by measuring the voltage of the detected output results at the signal detector and sending the voltage measurements from the signal detector to the logic device.

2. The method of claim 1, wherein applying test signals comprises applying test signals from the I/O pin to the coupled pin of the device under test.

3. The method of claim 1, further comprising reporting the analysis.

4. The method of claim 1, further comprising reconfiguring the configurable logic device to apply further test signals, applying the further test signals, and analyzing the further test signals.

5. The method of claim 4, further comprising repeating reconfiguring and applying further test signals and analyzing further results.

6. The method of claim 1, wherein the configurable logic device comprises a field programmable gate array.

7. The method of claim 1, wherein configuring comprises sending commands from a general purpose station controller to the reconfigurable logic device.

8. The method of claim 1, wherein setting an electrical configuration comprises applying a pull-up resistor to the I/O pin.

9. The method of claim 1, wherein applying comprises applying test signals to an input pin of the device under test and analyzing comprises detecting voltages at the input pin.

10. An article comprising a machine readable medium including data that when accessed by a machine causes the machine to perform operations comprising:
configuring a reconfigurable logic device to comply with input standards of a device under test;

setting an electrical configuration of an I/O pin of the logic device, the I/O pin being directly coupled to a pin of the device under test;

applying test signals to the device under test through the I/O pin; and receiving voltage measurements from a signal detector coupled to the reconfigurable logic device for two-way communication, the signal detector receiving control signals from the logic device, receiving output results from the device under test through the I/O pin, measuring the voltage thereof, and sending the voltage measurements from the signal detector to the logic device.

11. The article of claim 10, wherein the data further comprises data causing the machine to perform further operations comprising powering up the device under test after configuring.

12. The article of claim 11, wherein the data further comprises data causing the machine to perform further operations comprising reconfiguring the configurable logic device to apply further test signals, applying the further test signals, and analyzing the further test signals.

13. The article of claim 11, wherein configuring comprises sending commands from a general purpose station controller to the reconfigurable logic device.

14. An apparatus comprising:
a reconfigurable logic device to generate test signals to be applied from pins of the reconfigurable logic device to pins of a device under test, the logic device being directly coupled to the device under test; and a signal detector to detect signals from the pins of the device under test, to generate a voltage measurement of the detected signals, and to send the voltage measurement to the logic device, the logic device being coupled to the signal detector for two-way communications, wherein the logic device sends control signals to the signal detector and receives voltage measurements from the signal detector.

15. The apparatus of claim 14, wherein the logic device is coupled to an external interface to receive control signals to run test procedures directed to the device under test.

16. The apparatus of claim 14, wherein the logic device is coupled to the device under test through a plurality of I/O pins and wherein the logic device is coupled to an external interface to receive control signals to reconfigure the I/O pins.

17. The apparatus of claim 14, wherein the voltage measurement comprises a threshold comparison from the signal detector.

18. The apparatus of claim 14, wherein the signal. detector comprises a voltage comparator.

19. An apparatus comprising:
a reconfigurable logic device to generate test signals to be applied from pins of the reconfigurable logic device to pins of a device under test;

a socket to carry the device under test, the socket having connectors coupled to the pins of the device under test to carry signals to and from the pins, so that the logic device is directly coupled to a device under test, when the device under test is in the socket;

a signal detector to detect signals from the connectors of the socket, and to generate a voltage measurement of the detected signals, the signal detector also being coupled to the reconfigurable logic device for two-way communications to send the voltage measurement to the logic device and to receive control signals from the logic device; and a circuit board to couple pins of the reconfigurable logic device to connectors of the socket.

20. The apparatus of claim 19, further comprising a power supply to supply power to a device under test carried by the socket.

21. The apparatus of claim 20, further comprising an external interface on the circuit board to receive control signals to control the power supply.

22. The apparatus of claim 19, further comprising an external interface on the circuit board to receive control signals to reconfigure the reconfigurable logic device.

23. The apparatus of claim 19, wherein the reconfigurable logic device comprises a field programmable gate array.

24. The apparatus of claim 19, wherein the signal detector comprises a voltage comparator.

25. An apparatus comprising:
a reconfigurable logic device to generate test signals to be applied from pins of the reconfigurable logic device to pins of a device under test;

a socket to carry the device under test, the socket having connectors coupled to the pins of the device under test to carry signals to and from the pins, so that the logic device is directly coupled to a device under test, when the device under test is in the socket;

a signal detector coupled to the reconfigurable logic device to detect signals from the connectors of the socket, and to generate a voltage measurement of the detected signals, the signal detector also being coupled to the reconfigurable logic device for two-way communications to and to send the voltage measurement to the logic device and to receive control signals from the logic device;

a circuit board to couple pins of the reconfigurable logic device to connectors of the socket;

a power supply to supply power to a device under test carried by the socket; and an external interface on the circuit board to receive control signals to control the power supply.

26. The apparatus of claim 25, further comprising an external interface on the circuit board to receive control signals to reconfigure the reconfigurable logic device.

27. The apparatus of claim 26, wherein the signal detector comprises a voltage comparator.

* * * * *